United States Patent
Iravani

(10) Patent No.: US 9,100,024 B2
(45) Date of Patent: Aug. 4, 2015

(54) CLOCK AND DATA RECOVERY TOLERATING LONG CONSECUTIVE IDENTICAL DIGITS

(71) Applicant: PICO Semiconductor, Inc., Los Altos, CA (US)

(72) Inventor: Kamran Iravani, Los Altos, CA (US)

(73) Assignee: Pico Semiconductor, Inc., Los Altos, CA (US)

( * ) Notice: Subject to any disclaimer, the term of this patent is extended or adjusted under 35 U.S.C. 154(b) by 0 days.

(21) Appl. No.: 14/247,095

(22) Filed: Apr. 7, 2014

(65) Prior Publication Data

US 2014/0301515 A1    Oct. 9, 2014

Related U.S. Application Data

(60) Provisional application No. 61/809,235, filed on Apr. 5, 2013.

(51) Int. Cl.
| | | |
|---|---|---|
| H03D 3/24 | (2006.01) | |
| H03L 7/08 | (2006.01) | |
| H03L 7/089 | (2006.01) | |
| H03L 7/14 | (2006.01) | |

(52) U.S. Cl.
CPC ............ *H03L 7/0807* (2013.01); *H03L 7/0893* (2013.01); *H03L 7/14* (2013.01)

(58) Field of Classification Search
CPC ....... H03L 7/091; H03L 7/087; H03L 7/0891; H03L 2207/06; H03L 7/089; H04L 7/033
USPC ..................... 375/376; 331/16, 1 A
See application file for complete search history.

(56) References Cited

U.S. PATENT DOCUMENTS

| | | | |
|---|---|---|---|
| 8,259,890 B2* | 9/2012 | Chen et al. ............... | 375/376 |
| 2006/0197611 A1* | 9/2006 | Yan .................. | 331/16 |
| 2009/0085679 A1* | 4/2009 | Jennings et al. ............. | 331/1 A |
| 2011/0075781 A1* | 3/2011 | Kenney ..................... | 375/376 |

\* cited by examiner

*Primary Examiner* — Don N Vo

(57) ABSTRACT

A high performance CDR circuit. The circuit includes a first and second sampler, a first and second charge-pump coupled to the first and the second sampler, a capacitor coupled to the first charge pump, and a filter coupled to the second charge pump. A VCO circuit is coupled to the first charge pump and the second charge pump, wherein a path for setting a frequency is provided by the first charge pump and the capacitor, and wherein a path for phase is provided by the second charge pump, wherein a voltage of the capacitor is stable to enable the VCO to tolerate CIDs.

15 Claims, 1 Drawing Sheet

CLOCK AND DATA RECOVERY TOLERATING LONG CONSECUTIVE IDENTICAL DIGITS

CROSS-REFERENCE TO RELATED APPLICATIONS

This application is a conversion of and claims priority to and the benefit of Provisional Patent Application No. 61/809, 235, entitled "CLOCK AND DATA RECOVERY TOLERATING LONG CONSECUTIVE IDENTICAL DIGITS," having a filing Date of Apr. 5, 2013, which is herein incorporated by reference in its entirety.

TECHNICAL FIELD

The present invention relates to the field of CMOS technology Clock and Data Recovery (CDR). More particularly, the present invention relates to a CDR tolerating long Consecutive Identical Digits (CID).

BACKGROUND ART

CDRs are well known and widely used in the electronics industry. Within the digital field, CDR are used in a variety of applications. Such applications include, for example, wireline communications such as PCI express and SATA, and optical communications such as SONET and GPON. CDRs are typically designed to perform within a given set of boundary conditions and to perform according to a specified standard. Typical conditions include, for example, performance over operating temperature ranges, sensitivity to noise, output sensitivity to interference, and the like. Typical performance standards include, for example, Input signal jitter tolerance, output signal frequency stability, output signal programmability, and the like.

A typical prior art CDR circuit generates an oscillating output clock signal having a specified frequency, and recovered data. The frequency of the output is tunable and is a function of an input data, or the like. The type of application in which the CDR circuit is used dictates its operating conditions and performance requirements.

In addition, the type of application also largely determines type of fabrication technology used to manufacture the CDR. A large number of modern digital integrated circuits are fabricated using well known and widely used CMOS technology. Where the CDR circuit is included in a CMOS IC (integrated circuit), it is usually fabricated in CMOS (e.g., fabricated using CMOS process technology).

There is a problem, however, when the application in which the overall IC is used requires the CDR circuit to handle input data with long CID. For example, where the IC is part of a high speed serial transmission system (e.g., high speed optical communication systems) it is important that the CDR to have good jitter tolerance when CID is long. Prior art CMOS CDRs have tried to solve this issue. Typically digital CDRs are used to handle long CIDs. However, because of the fact that in digital CDRs the loop is very slow, it will be problematic for some applications, and make the system unreliable.

Thus, what is required is a CMOS CDR circuit which solves the problems of the prior art. What is required is a circuit capable of reliable operation while exhibiting good jitter tolerance when CID is long. What is required is a circuit with high jitter tolerance free of defects and irregularities even when the input pattern has long CID. The present invention provides an advantageous solution to the above requirements.

DISCLOSURE OF THE INVENTION

Embodiments of the present invention provide a CDR circuit which solves the jitter tolerance problems of the prior art. The present invention provides a circuit capable of reliable operation while exhibiting very good jitter tolerance.

In one embodiment, the present invention is implemented as a high performance CDR circuit. The CDR includes two or more slicers (or samplers), a bang-bang phase detector, two or more charge-pumps, a buffer, a capacitor, a filter, a VCO circuit and a divider which can be removed depending on the application. In this implementation there are 2 charge pumps (CP1 and CP2). The path for frequency (with cp1 and capacitor C1), and the path for phase (with CP2) are separated. By choosing a very low current for CP1, the voltage of C1 after each data transition changes with a very small value. Therefore, when there is no data transition, the voltage of C1 still is very close to the right value so the loop can tolerate longer CIDs.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

The present invention provides a CMOS CDR circuit which solves the long CID operation problems of the prior art. The present invention provides a circuit capable of reliable operation while tolerating long CIDs. The circuit of the present invention produces a stable, output signal with a waveform free of defects and irregularities. The present invention and its benefits are described in greater detail below.

Figure 1:
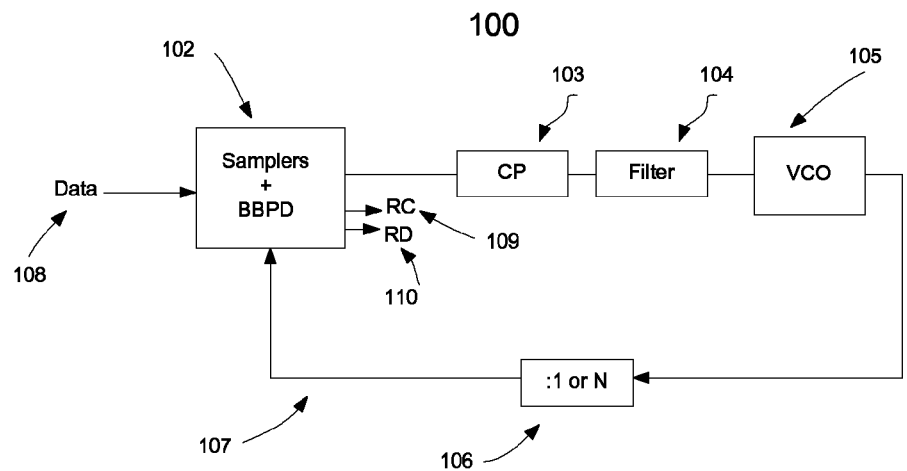
FIG. 1 shows a schematic block diagram of a conventional nonlinear CDR with bang-bang (Alexander) phase detector.

FIG. 1 shows a block diagram of a conventional bang-bang CDR 100 in accordance with one embodiment of the present invention. CDR 100 is comprised of slicers (or samplers) and a bang-bang Phase Detector (BBPD) 102 followed by a Charge-Pump (CP) 103, a filter 104, a VCO 105 and a divider 106 in the feedback path 107 with its output connected to the slicers and BBPD 102. The other input of the slicers/BBPD comes from the input data 108. The outputs of the CDR 100 are the recovered clock (RC) 109 and recovered data (RD) 110. In this circuit after each data transition, based on the fact that it is early or late with respect to the clock signal, BBPD send a signal to the Charge-pump, and the charge-pump charge or discharge the filter accordingly to adjust the frequency of the VCO to the right direction. If there is no data transition, there will be no pulse from the BBPD to the charge-pump, and there will not be any adjustment for the VCO frequency. If there is a long CID meaning there is no data transition for many cycles, we may see errors in the recovered data (RD). This is mainly because of the VCO frequency which may not be at the right value. The drift in the frequency of the VCO causes (after several cycles) a phase accumulation which shifts the edge of the clock from the right position, and it cannot sample the data at the right time, and it creates error. Besides the leakage current in the filter and the devices connected to the filter which will cause a small drift in the VCO input, the main reason for the frequency not to be right is the fact that before the long CID starts, there might be consecutive charging or consecutive discharging the filter by the charge-pump because of the input jitter. This may cause the voltage of the big capacitor C1 to be a little away from the average just before the long CID starts. Therefore, there will be phase shift in the VCO clock. To solve this problem we cannot reduce the charge-pump current because it will impact the loop response and the performance.

Figure 2:
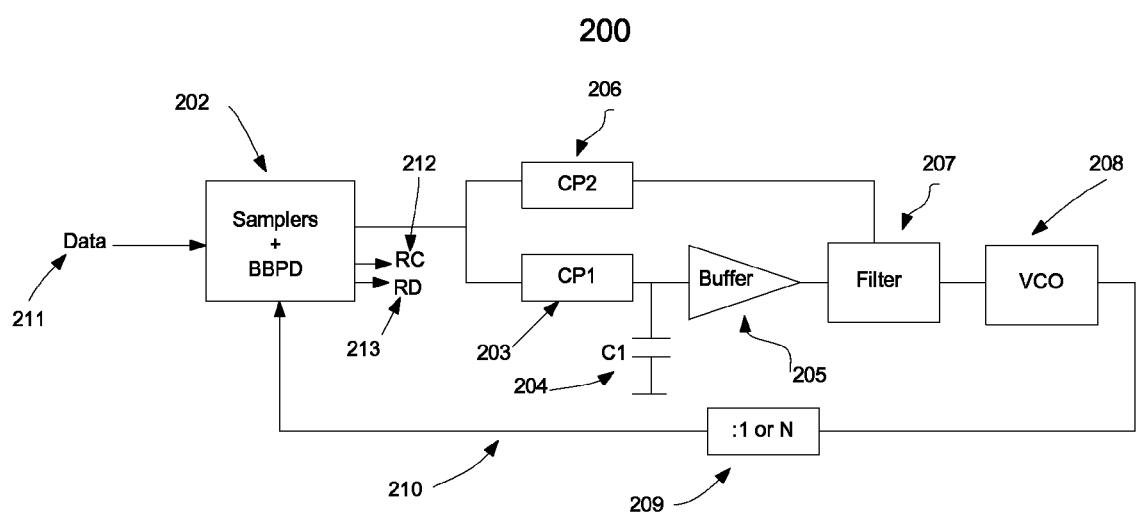
FIG. 2 shows the nonlinear CDR with 2 charge-pumps in accordance with one embodiment of the present invention.

FIG. 2 shows a block diagram of the proposed CDR 200. CDR 200 is comprised of slicers (or samplers) and a bang-bang Phase Detector (BBPD) 202 followed by Charge-Pump (CP1) 203, capacitor C1 204, buffer 205 charge-pump (cp2) 206, a filter 207, a VCO 208 and a divider 209 in the feedback path 210 with its output connected to the slicers and BBPD 202. The other input of the slicers/BBPD comes from the input data 211. The outputs of the CDR 200 are the recovered clock (RC) 212 and recovered data (RD) 213. In this CDR C1 is charged and discharged by charge-pump cp1, and in the locked condition the output of the buffer generates a voltage equal to the average voltage needed at the input of the VCO. The buffer can be a unity gain amplifier or a low gain amplifier. If the current of the charge-pump cp1 is set to be very low, the deviation of the voltage at the output of the buffer from the average voltage will be small. Therefore, it can handle longer CID compared to conventional methods. With this technique we can still keep the loop response very fast because the current of charge-pump cp2 and the filter components can mainly set the loop response. Therefore this scheme does not have the problem of digital CDRs.

The idea of using 2 charge-pumps has been used in the past for the Phase-locked loops (PLLs) for different purposes. However, it is for the first time that the idea is used for nonlinear CDRs.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A high performance Clock Data Recovery (CDR) circuit, comprising:
   a first and second sampler;
   a first and second charge-pump coupled to the first and the second sampler;
   a capacitor coupled to the first charge pump;
   a filter coupled to the second charge pump;
   a Voltage Controlled Oscillator (VCO) circuit coupled to the first charge pump and the second charge pump, wherein a path for setting a frequency is provided by the first charge pump and the capacitor, and wherein a path for phase is provided by the second charge pump, wherein a voltage of the capacitor is stable to enable the VCO to tolerate Consecutive Identical Digits (CIDs).

2. The circuit of claim 1, wherein a buffer is included between the first charge pump and the filter.

3. The circuit of claim 2, wherein a divider is included in a feedback path between the VCO and the first sampler and the second sampler.

4. The circuit of claim 1, wherein a bang-bang phase detector is coupled to the first sampler and the second sampler.

5. The circuit of claim 1, wherein a current for the first charge pump is less than a current for the second charge pump.

6. An integrated circuit device, comprising:
   a first and second sampler;
   a first and second charge-pump coupled to the first and the second sampler;
   a capacitor coupled to the first charge pump;
   a filter coupled to the second charge pump;
   a Voltage Controlled Oscillator (VCO) circuit coupled to the first charge pump and the second charge pump, wherein a path for setting a frequency is provided by the first charge pump and the capacitor, and wherein a path for phase is provided by the second charge pump, wherein a voltage of the capacitor is stable to enable the VCO to tolerate Consecutive Identical Digits (CIDs).

7. The integrated circuit device of claim 6, wherein a buffer is included between the first charge pump and the filter.

8. The integrated circuit device of claim 7, wherein a divider is included in a feedback path between the VCO and the first sampler and the second sampler.

9. The integrated circuit device of claim 6, wherein a bang-bang phase detector is coupled to the first sampler and the second sampler.

10. The integrated circuit device of claim 6, wherein a current for the first charge pump is less than a current for the second charge pump.

11. A high performance Clock Data Recovery (CDR) device having the ability to tolerate Consecutive Identical Digits (CIDs), comprising:
    a first and second sampler;
    a first and second charge-pump coupled to the first and the second sampler;
    a capacitor coupled to the first charge pump;
    a filter coupled to the second charge pump;
    a Voltage Controlled Oscillator (VCO) circuit coupled to the first charge pump and the second charge pump, wherein a path for setting a frequency is provided by the first charge pump and the capacitor, and wherein a path for phase is provided by the second charge pump, wherein a voltage of the capacitor is stable to enable the VCO to tolerate CIDs.

12. The device of claim 11, wherein a buffer is included between the first charge pump and the filter.

13. The device of claim 12, wherein a divider is included in a feedback path between the VCO and the first sampler and the second sampler.

14. The device of claim 11, wherein a bang-bang phase detector is coupled to the first sampler and the second sampler.

15. The device of claim 11, wherein a current for the first charge pump is less than a current for the second charge pump.

* * * * *